United States Patent
Lee et al.

(10) Patent No.: US 10,232,726 B2
(45) Date of Patent: Mar. 19, 2019

(54) VEHICLE CHARGER AND CONTROL PILOT SIGNAL DETECTION METHOD THEREOF

(71) Applicants: Hyundai Motor Company, Seoul (KR); Kia Motors Corporation, Seoul (KR)

(72) Inventors: Jae Won Lee, Gyeonggi-do (KR); Jung Hwan Na, Gyeonggi-do (KR); Tae Hwan Chung, Incheon (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 111 days.

(21) Appl. No.: 14/741,508

(22) Filed: Jun. 17, 2015

(65) Prior Publication Data
US 2016/0096442 A1   Apr. 7, 2016

(30) Foreign Application Priority Data
Oct. 2, 2014  (KR) .......................... 10-2014-0133275

(51) Int. Cl.
*H03K 21/38* (2006.01)
*B60L 11/18* (2006.01)
*H03K 21/08* (2006.01)

(52) U.S. Cl.
CPC .......... *B60L 11/1848* (2013.01); *H03K 21/38* (2013.01); *Y02T 10/7005* (2013.01); *Y02T 10/7072* (2013.01); *Y02T 90/121* (2013.01); *Y02T 90/128* (2013.01); *Y02T 90/14* (2013.01);
(Continued)

(58) Field of Classification Search
CPC .... B60L 11/1848; B60L 11/18; B60L 11/123; B60L 11/1811; B60L 11/1812; B60L 11/14; B60L 11/1816; B60L 11/1824; B60L 11/1842; B60L 11/005; B60L 11/1818; B60L 1/006; B60L 3/0069; B60L 3/04; B60L 9/00; B60L 15/007; B60L 2270/36;
(Continued)

(56) References Cited

U.S. PATENT DOCUMENTS 8,301,322 B2 * 10/2012 Mitsutani ............... B60K 6/445
                                                        180/65.21
8,749,198 B2    6/2014 Klesyk
(Continued)

FOREIGN PATENT DOCUMENTS

JP         4539785 B2    9/2010
JP      2010-233360 A   10/2010
(Continued)

*Primary Examiner* — Richard Isla
*Assistant Examiner* — Dung V Bui
(74) *Attorney, Agent, or Firm* — Mintz Levin Cohn Ferris Glovsky and Popeo, P.C.; Peter F. Corless

(57) ABSTRACT

A control pilot (CP) signal detection method for a vehicle charger includes: counting CP signals based on signal levels of the CP signals during a set period of time, when an input of the CP signals is detected while an ignition of a vehicle is turned off; determining whether a count of high-level CP signals among the CP signals is within a reference range, when the set period of time elapses; and outputting state information of the CP signals based on the determination of whether the count of high-level CP signals is within the reference range.

11 Claims, 4 Drawing Sheets

(52) U.S. Cl.
CPC ............ *Y02T 90/163* (2013.01); *Y02T 90/169* (2013.01); *Y04S 30/14* (2013.01)

(58) Field of Classification Search
CPC .... B60L 2210/30; H03K 21/38; H03K 21/08; B60W 10/26; B60K 6/365; B60K 1/02
USPC ....... 320/109, 107, 128, 137, 163, 125, 104, 320/164; 324/76.11, 538, 555, 522; 701/22; 702/63
See application file for complete search history.

(56) References Cited

U.S. PATENT DOCUMENTS

| | | | | |
|---|---|---|---|---|
| 2010/0079105 | A1* | 4/2010 | Iwanaga | B60K 6/365 320/109 |
| 2011/0057611 | A1* | 3/2011 | Nakaso | B60K 6/365 320/109 |
| 2011/0216451 | A1* | 9/2011 | Haines | B60L 3/0069 361/42 |
| 2011/0288710 | A1* | 11/2011 | Ito | B60L 3/00 701/22 |
| 2012/0016547 | A1* | 1/2012 | Aridome | B60K 6/365 701/22 |
| 2012/0098490 | A1* | 4/2012 | Masuda | B60L 3/0069 320/109 |
| 2013/0119931 | A1* | 5/2013 | Klesyk | H03K 5/04 320/109 |
| 2013/0162208 | A1* | 6/2013 | Ohnuki | B60L 11/1803 320/109 |
| 2013/0320922 | A1 | 12/2013 | Acena et al. | |
| 2014/0232355 | A1* | 8/2014 | Masuda | B60L 3/0069 320/137 |
| 2014/0253018 | A1* | 9/2014 | Kong | B60L 11/1812 320/104 |

FOREIGN PATENT DOCUMENTS

| | | |
|---|---|---|
| JP | 2010-239670 A | 10/2010 |
| KR | 10-2013-0081973 A | 7/2013 |
| KR | 10-2014-0084369 A | 7/2014 |

* cited by examiner

VEHICLE CHARGER AND CONTROL PILOT SIGNAL DETECTION METHOD THEREOF

CROSS-REFERENCE TO RELATED APPLICATION

This application claims priority to and the benefit of Korean Patent Application No. 10-2014-0133275, filed on Oct. 2, 2014 in the Korean Intellectual Property Office, the disclosure of which is incorporated herein in its entirety by reference.

TECHNICAL FIELD

The present disclosure relates generally to a vehicle charger and control pilot (CP) detection method thereof, and more particularly, to a vehicle charger for detecting a CP signal generated by an electric vehicle supply equipment (EVSE) in a state in which an ignition of an electric vehicle (EV) is turned off, as well as a CP signal detection method of the vehicle charger.

BACKGROUND

When a connector of an EVSE is connected to perform a charging procedure while a vehicle ignition is turned off, a control power source of a charger mounted in the vehicle needs to be turned on. However, it may be difficult to directly turn on the control power source using a signal provided in a charge standard for chargers (e.g., SAE J1772™ (SAE Electric Vehicle and Plug in Hybrid Electric Vehicle Conductive Charge Coupler)). Instead, the EVSE may transmit a CP signal to the charger. Because the CP signal is a pulse width modulation (PWM) signal, it may be difficult to maintain an on-state of the control power source of the charger using the CP signal.

Accordingly, in the related art, the following two methods are typically used:

First, a control power source may be enabled using a CP detection circuit that operates at all times independently of the control power source. Second, a sub-power source may be initially turned on in response to an input of a CP signal, may process the CP signal, and then continue to generate a signal to enable the control power source to operate. In the first method, a large number of issues can occur due to dark current and the like. Meanwhile, in the second method, various methods may be used to configure a circuit; however, issues associated with a response, reliability, and distribution of the circuit due to an analog circuit may occur. Additionally, the number of circuits may exponentially increase due to additional functional requirements. For example, malfunctioning may be highly likely due to a change in a duty condition of the CP signal, a change in an input voltage condition, or an inflow of noise.

SUMMARY

The present disclosure has been made to solve the above-mentioned problems occurring in the related art while advantages achieved by the related art are maintained intact.

An aspect of the present disclosure provides a vehicle charger that is capable of detecting a CP signal generated by an EVSE in order to control (e.g., turn on or off) a control power source of a charger while an EV ignition is turned off. Another aspect of the present disclosure provides a CP signal detection method for the vehicle charger.

According to embodiments of the present disclosure, a CP signal detection method for a vehicle charger includes: counting CP signals based on signal levels of the CP signals during a set period of time, when an input of the CP signals is detected while an ignition of a vehicle is turned off; determining whether a count of high-level CP signals among the CP signals is within a reference range, when the set period of time elapses; and outputting state information of the CP signals based on the determination of whether the count of high-level CP signals is within the reference range.

The counting of the CP signals may include: verifying the signal levels of the CP signals at a set period, classifying the CP signals into the high-level CP signals and low-level CP signals based on the verified signal levels, counting the high-level CP signals, and counting the low-level CP signals.

The outputting of state information of the CP signals may include outputting state information indicating that the CP signals have been inputted and are PWM signals, when the count of the high-level CP signals is within the reference range.

The outputting of state information of the CP signals may include outputting state information indicating that the CP signals have been inputted and are DC signals, when the count of the high-level CP signals exceeds an upper limit threshold of the reference range.

The outputting of state information of the CP signals may include outputting state information indicating that the CP signals have not been detected, when the count of the high-level CP signals is less than a lower limit threshold of the reference range.

Furthermore, according to embodiments of the present disclosure, a vehicle charger for charging a battery mounted in an EV by receiving power supplied from an EVSE includes: a charging controller configured to control a charging operation of the vehicle charger; a main power source configured to supply main power to the charging controller and to cut-off the main power; a sub-power source configured to supply power to the battery as sub-power, when CP signals generated by the EVSE are input; and a power controller configured to monitor the CP signals generated by the EVSE while an ignition of the EV is turned off and to turn the main power source and the sub-power source on or off, respectively.

The power controller may include a CP detector configured to classify and count the CP signals based on signal levels of the CP signals during a set period of time, to determine whether a count of the CP signals is within a reference range, and to output state information of the CP signals based on the determination of whether the count of the CP signals is within the reference range, an on/off controller configured to turn the main power source and the sub-power source on or off, based on the outputted state information, and a clock generator configured to generate a clock signal to synchronize the CP detector and the on/off controller.

The CP detector may be further configured to verify the signal levels of the CP signals every time the clock signal is generated, to classify the CP signals into high-level CP signals and low-level CP signals based on the verified signal levels, to count the high-level CP signals, and to count the low-level CP signals.

The CP detector may be further configured to output state information indicating that the CP signals have been inputted and are PWM signals, when a count of the high-level CP signals is within the reference range.

The CP detector may be further configured to output state information indicating that the CP signals have been inputted and are DC signals, when a count of the high-level CP signals exceeds an upper limit threshold of the reference range.

The CP detector may be further configured to output state information indicating that the CP signals have not been detected, when a count of the high-level CP signals is less than a lower limit threshold of the reference range.

Furthermore, according to embodiments of the present disclosure, a CP signal detection method for a vehicle charger includes: classifying CP signals into high-level CP signals and low-level CP signals based on signal levels of the CP signals, and counting the high-level CP signals and the low-level CP signals, respectively, during a set period of time, while an ignition of a vehicle is turned off; determining which of a count of the high-level CP signals and a count of the low-level CP signals exceeds a threshold; and determining that a CP signal with a corresponding level is detected, based on which of the count of the high-level CP signals or the count of the low-level CP signals exceeds the threshold.

The CP signal detection method may further include invalidating a detection of the high-level CP signal, when the low-level CP signal is detected after the high-level CP signal is determined to be detected.

The CP signal detection method may further include invalidating a detection of the low-level CP signal, when the high-level CP signal is detected after the low-level CP signal is determined to be detected.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION OF THE EMBODIMENTS

Figure 1:
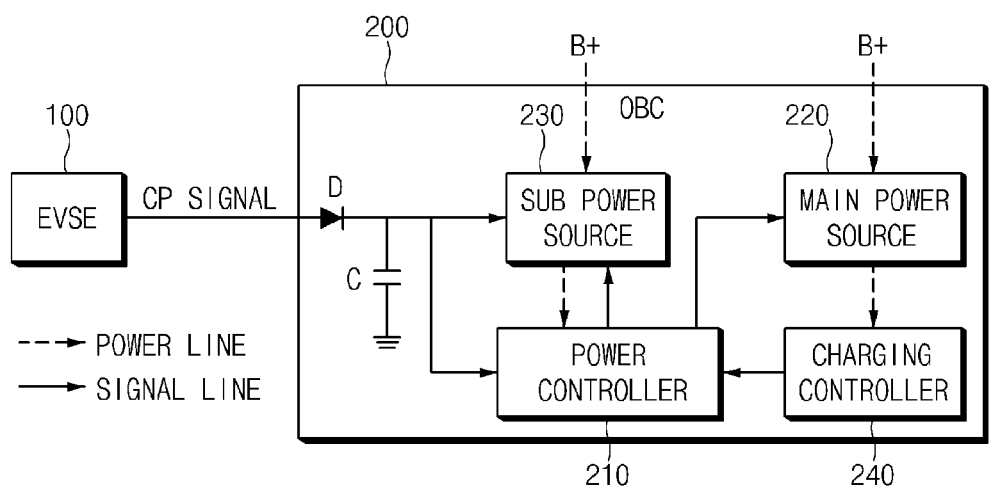
FIG. 1 is a block view showing a vehicle charging system according to embodiments of the present disclosure.

Hereinafter, embodiments of the present disclosure will be described in detail with reference to the accompanying drawings. As those skilled in the art would realize, the described embodiments may be modified in various different ways, all without departing from the spirit or scope of the present disclosure. Further, throughout the specification, like reference numerals refer to like elements.

Throughout the present specification, unless explicitly described to the contrary, the word "comprise," and variations such as "comprises" and "comprising," will be understood to imply the inclusion of stated elements but not the exclusion of any other element. Additionally, the terms "unit," "device," and "module" used in the present specification represent a unit for processing at least one function or operation, which can be implemented by hardware, software, or a combination of hardware and software. Also, the singular forms "a," "an" and "the" used herein are used to include the plural forms as well, unless otherwise stated in the present specification or explicit in the context.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that one or more of the below methods, or aspects thereof, may be executed by at least one controller. The term "controller" may refer to a hardware device that includes a memory and a processor. The memory is configured to store program instructions, and the processor is specifically programmed to execute the program instructions to perform one or more processes which are described further below. Moreover, it is understood that the below methods may be executed by an apparatus comprising the controller in conjunction with one or more other components, as would be appreciated by a person of ordinary skill in the art.

Referring now to the disclosed embodiments, the present disclosure relates to a charger mounted in an EV and provides a scheme of detecting a CP signal using the charger. FIG. 1 is a block view showing a vehicle charging system according to embodiments of the present disclosure.

As shown in FIG. 1, the vehicle charging system may include an EVSE 100, and a vehicle charger 200. The EVSE 100 may be connected to a vehicle via a connector, and may charge a battery (not shown), using the vehicle charger 200. The battery may supply a driving power of the vehicle. The EVSE 100 may generate a CP signal. The CP signal may be generated as a 12 volts (V) DC signal (e.g., for a connection to a connector), a 9 V DC signal (e.g., for a standby time and a reservation time), a 9 V PWM signal (e.g., for beginning of charging), a 6 V PWM signal (e.g., begin charging), and the like.

The vehicle charger 200 may be an on-board charger (OBC) installed in a vehicle, and may include a power controller 210, a main power source 220, a sub-power source 230, and a charging controller 240. The power controller 210 may detect a CP signal transmitted from the EVSE 100 in a state in which an ignition of an EV is turned off, and may control cutting off of a control power supply to the vehicle charger 200 based on the detected CP signal. In other words, the power controller 210 may monitor the CP signal, and may control the control power source of the vehicle charger 200 based on state information of the CP signal.

The power controller 210 may be implemented as a programmable device, for example, a complex programmable logic device (CPLD) or a field programmable gate array (FPGA). As described above, the power controller 210 according to the present disclosure may be implemented in software and accordingly, it is possible to implement an additional function without an additional cost, and to reduce costs.

The main power source 220 may supply a battery power B+ to the charging controller 240, or may cut-off the battery power B+, under a control of the power controller 210. The battery power B+ may be output from a battery (e.g., a high voltage battery) mounted in a vehicle. The sub-power source 230 may supply the battery power B+ to the power controller 210, in response to a CP signal generated by the EVSE 100 being input. In other words, when an input of the CP signal is detected, the sub-power source 230 may be turned on and may enable the power controller 210 to operate.

The charging controller 240 may control an overall operation of the vehicle charger 200. In other words, the charging controller 240 may receive control power through the main power source 220, and may control charging of the battery.

Figure 2:
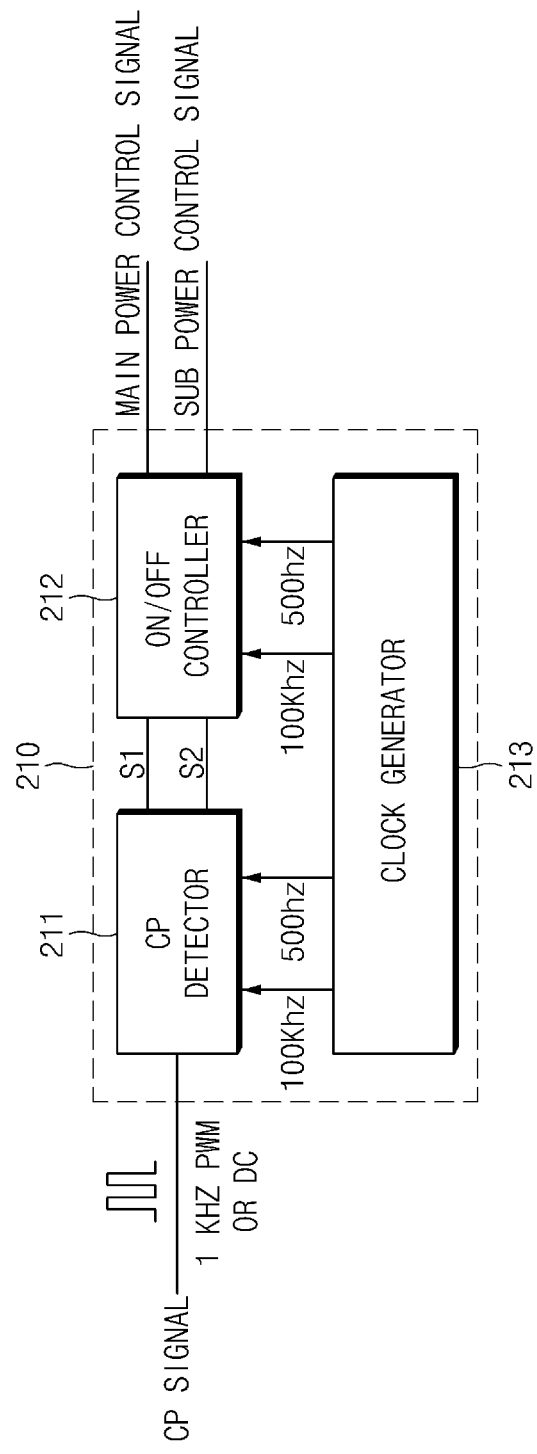
FIG. 2 is a block view showing a power controller of FIG. 1.

FIG. 2 is a block view showing the power controller 210 of FIG. 1. As shown in FIG. 2, the power controller 210 may include a CP detector 211, an ON/OFF controller 212, and a clock generator 213.

The CP detector 211 may monitor a CP signal generated by the EVSE 100, when the EVSE 100 is connected to the vehicle charger 200 via an interface. Additionally, the CP detector 211 may generate state information of the detected CP signal, and may output the state information. The state information may include information (e.g., signal(s)) S1 regarding whether a CP signal is detected and information S2 regarding a form of a signal, and a form of a signal may include, e.g., a DC and a PWM. Additionally, the state information may be signal level information of a CP signal, and may include information S1 regarding whether a high-level CP signal is detected, and information S2 regarding whether a low-level CP signal is detected.

The CP detector 211 may verify a signal level of each of received CP signals during a period of time (e.g., 1 millisecond (ms)), may classify the CP signals into high-level CP signals and low-level CP signals based on the verified signal level, and may count the high-level CP signals and the low-level CP signals. The period of time may be set or determined.

The CP detector 211 may determine whether a count of the high-level CP signals is within a reference range. When the count of the high-level CP signals is within the reference range, the CP detector 211 may generate state information S1S2 "11" indicating a detection of the CP signals and a PWM signal. When the count of the high-level CP signals exceeds an upper limit threshold of the reference range, the CP detector 211 may generate state information S1S2 "10" indicating a detection of the CP signals and a DC signal. Additionally, when the count of the high-level CP signals is less than a lower limit threshold of the reference range, the CP detector 211 may recognize that a CP signal is not detected, and may generate state information S1S2 "00" or "01" indicating that the CP signal is not detected.

The CP detector 211 may verify a signal level of each of CP signals during a set period of time, may classify the CP signals into high-level CP signals and low-level CP signals, based on the signal level, and may count the high-level CP signals and the low-level CP signals. Additionally, the CP detector 211 may determine whether a count of the high-level CP signals is equal to or greater than a threshold, determine whether a count of the low-level CP signals is equal to or greater than the threshold, and may generate and output state information indicating whether a high level CP signal and a low level CP signal are detected, based on a determination result. In other words, when a count value is equal to or greater than a designated low limit value, the CP detector 211 may generate high and low detection signals.

The ON/OFF controller 212 may transmit a main power control signal and an sub-power control signal to the main power source 220 and the sub-power source 230, respectively, based on state information output from the CP detector 211. In other words, the ON/OFF controller 212 may control whether to operate the charging controller 240.

The clock generator 213 may generate a clock signal of a first frequency and a clock signal of a second frequency. When an sub-power source is turned on, the power controller 210 may be synchronized with the clock signals. The first frequency and the second frequency may be, for example, 100 kilohertz (kHz) and 500 hertz (Hz), respectively.

Figure 3:
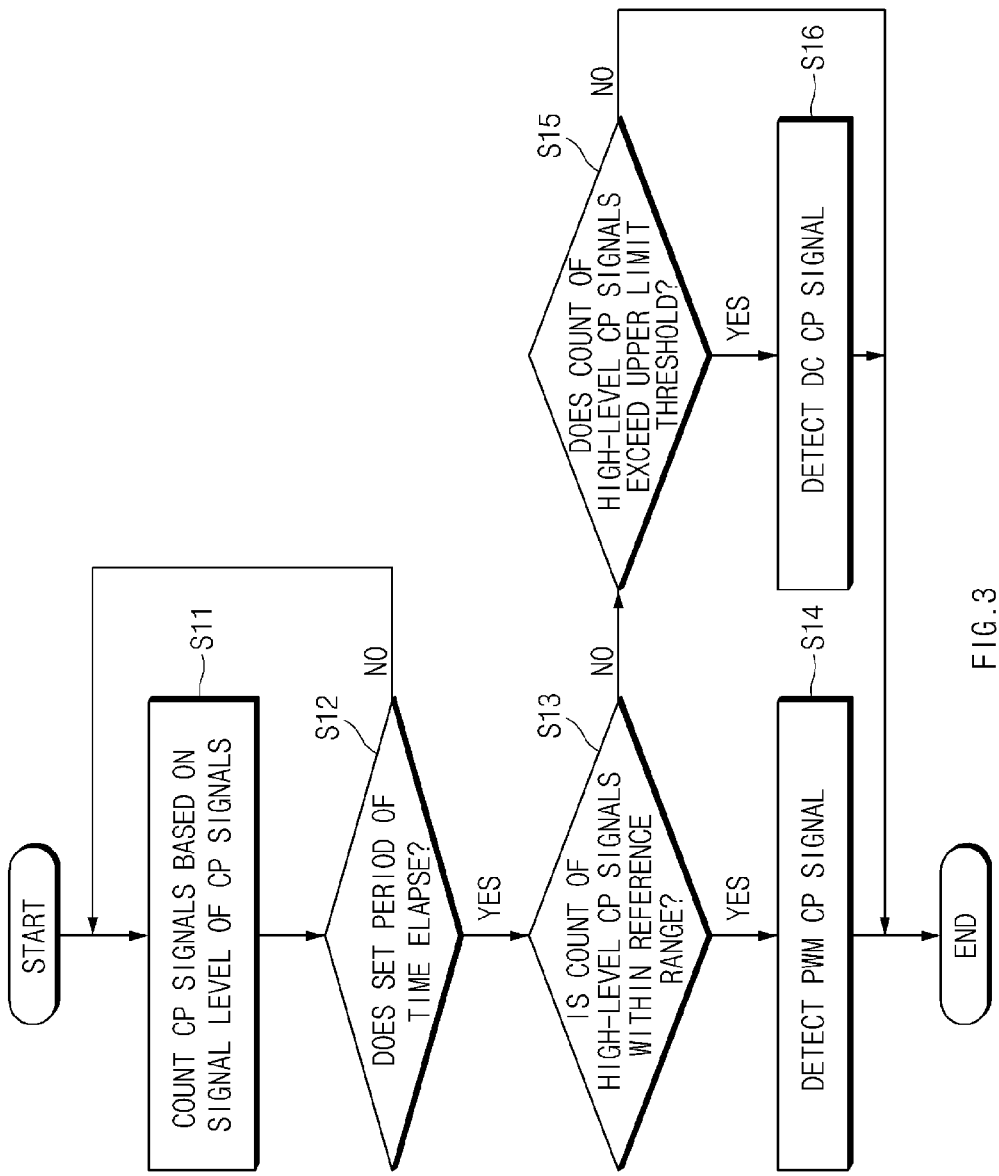
FIG. 3 is a flowchart showing a CP signal detection method of a vehicle charger according to embodiments of the present disclosure.

FIG. 3 is a flowchart showing a CP signal detection method of a vehicle charger according to embodiments of the present disclosure. As shown in FIG. 3, in operation S11, the vehicle charger 200 may verify a signal level of a CP signal input from the EVSE 100 every set period in a state in which an ignition of a vehicle is turned off, and may count high-level CP signals and low-level CP signals based on the verified signal level. In other words, the vehicle charger 200 may detect CP signals every set period (e.g., every time a clock of 100 kHz is generated), and may verify a signal level of each of the CP signals. When a CP signal has a high level, a count of high-level CP signals may be incremented by "1". When a CP signal has a low level, a count of low-level CP signals may be incremented by "1".

In operation S12, the vehicle charger 200 may repeat an operation of classifying the CP signals based on the signal level and counting the CP signals, until a set period of time elapses. For example, the CP detector 211 of the vehicle charger 200 may determine whether a sum of a count of high-level CP signals and a count of low-level CP signals is "100."

When the set period of time elapses, the CP detector 211 of the vehicle charger 200 may determine whether the count of the high-level CP signals is within a reference range in operation S13. When the count of the high-level CP signals is within the reference range, the CP detector 211 may transmit state information "11" indicating that a PWM CP signal is detected in operation S14. When the count of the high-level CP signals is beyond the reference range, the CP detector 211 may determine whether the count of the high-level CP signals exceeds an upper limit threshold of the reference range in operation S15. When the count of the high-level CP signals exceeds the upper limit threshold, the CP detector 211 may generate state information "10" indicating that a DC CP signal is detected, and may transmit the state information "10" in operation S16. Additionally, when the count of the high-level CP signals is less than a lower limit threshold of the reference range, the CP detector 211 may generate a signal "00" or "01" indicating that a CP signal is not detected, and may output the signal.

Figure 4:
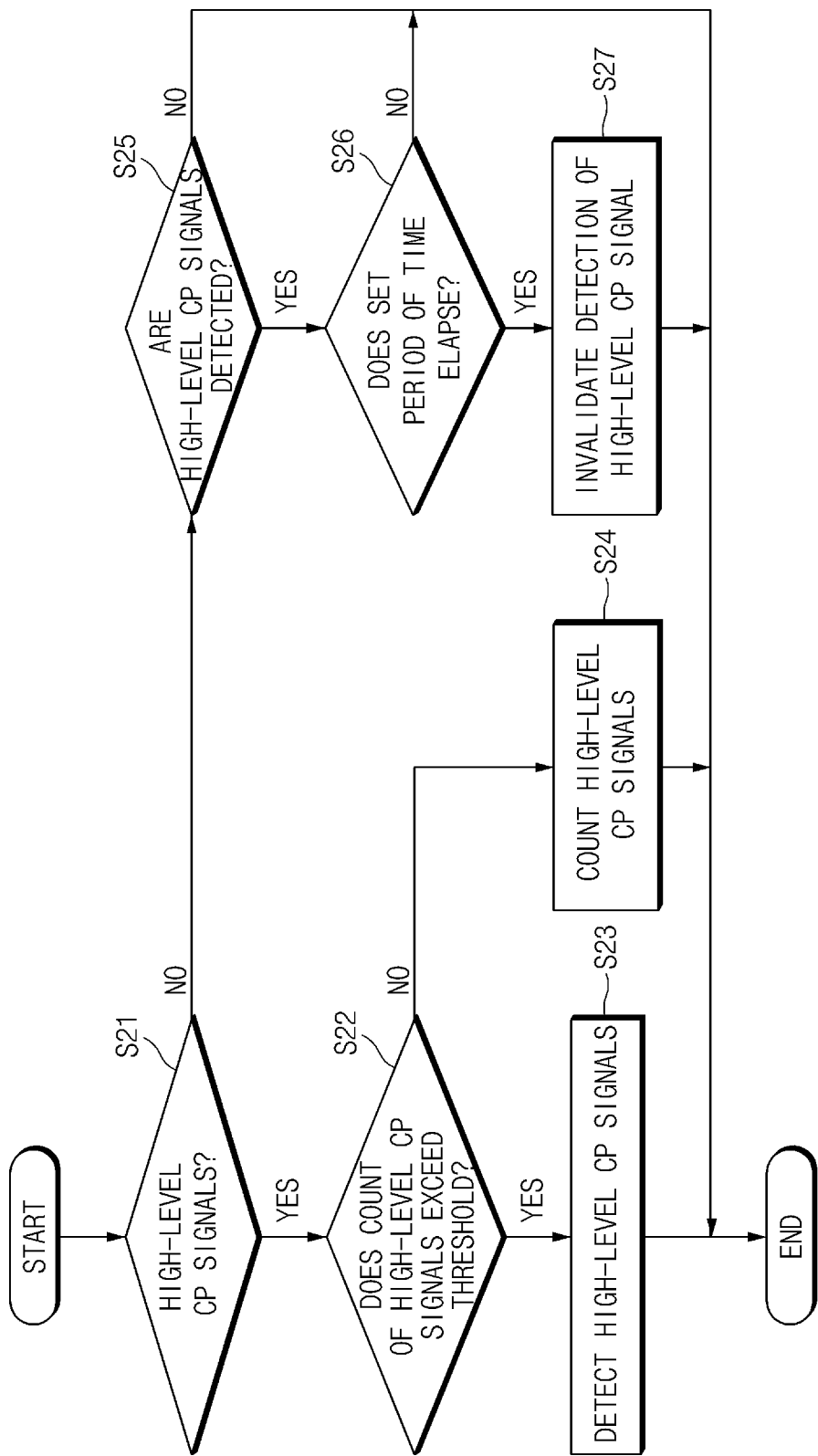
FIG. 4 is a flowchart showing a CP signal detection method of a vehicle charger according to embodiments of the present disclosure.

FIG. 4 is a flowchart showing a CP signal detection method of a vehicle charger according to embodiments of the present disclosure.

In operation S21, the CP detector 211 may detect CP signals every set period in a state in which an ignition of a vehicle is turned off, and may determine whether the CP signals are high-level CP signals. The CP detector 211 may detect CP signals at a period of a first frequency (e.g., 100 kHz).

When the CP signals are determined as high-level CP signals, the CP detector 211 may determine whether a count of the high-level CP signals exceeds a threshold in operation S22. When the count of the high-level CP signals exceeds the threshold, the CP detector 211 may output a signal S1 "1" indicating that the high-level CP signals are detected in operation S23. When the count of the high-level CP signals is determined not to exceed the threshold, the CP detector 211 may increment the count of the high-level CP signals by "1" in operation S24.

When operations S23 and S24 are performed, a count obtained by counting CP signals detected at a period of a second frequency (e.g., 500 Hz) may be initialized, and the detected CP signals may be stored in a memory (not shown). When the CP signals are determined not to be high-level CP signals, the CP detector 211 may determine whether the high-level CP signals are detected in operation S25. In other words, when the low-level CP signals are detected, the CP detector 211 may determine whether the high-level CP signals are detected. When a low-level CP signal is maintained during a predetermined period of time in a state in which a high-level CP signal is detected, the CP detector 211 may generate a signal indicating that the high-level CP signal is not detected, and may output the signal in operations S26 and S27. In other words, the CP detector 211 may invalidate a detection of the high-level CP signal.

Additionally, when low-level CP signals detected at the period of the second frequency are detected consecutively twice, the CP detector 211 may change a control signal S1 indicating whether a high-level CP signal is detected to "0." When a high-level CP signal is not detected, the CP detector 211 may generate a signal indicating that the high-level CP signal is not detected, and may output the signal. In other words, when a low-level CP signal is detected, the CP detector 211 may generate a signal indicating that a high-level CP signal is not detected, and may output the signal.

As described above, the CP detector 211 may determine whether a high-level CP signal is detected. While determining whether a high-level CP signal is detected, the CP detector 211 may determine whether a low-level CP signal is detected, using the same method as described above. When a low-level CP signal is maintained during a designated period of time, the CP detector 211 may generate a signal S2 "1" indicating that the low-level CP signal is detected. Subsequently, when a high-level CP signal is maintained during a set period of time, the CP detector 211 may generate a signal S2 "0" indicating that a low-level CP signal is not detected, and may output the signal.

As described above, according to embodiments of the present disclosure, it is possible to detect a CP signal generated by an EVSE, to control (e.g., turn on or off) a control power source of a charger while an ignition of an EV is turned off. Thus, it is possible to control the control power source of the charger, using the CP signal.

The above-described embodiments of the present disclosure correspond to predetermined combinations of elements and features of the present disclosure. Moreover, unless mentioned otherwise, the elements or features of the present disclosure may be considered as optional elements or features of the present disclosure. Herein, each element or feature of the present disclosure may also be operated or performed without being combined with other elements or features of the present disclosure. Additionally, embodiments of the present disclosure may be realized by combining some of the elements and/or features of the present disclosure. The order of operations described according to the embodiments of the present disclosure may be varied. Furthermore, a part of the configuration or features of any specific embodiment of the present disclosure may be included in another embodiment of the present disclosure, or may be replaced with a configuration or features of another embodiment of the present disclosure. In addition, it is apparent that claims that do not have any explicit citations within the scope of the claims of the present disclosure may either be combined to configure embodiments of the present disclosure, or be combined and included as a new claim during the amendment of the present disclosure after the filing for the patent application of the present disclosure.

The embodiments of the present disclosure may be implemented by various means, for example hardware, firmware, software, or any combination thereof. For a hardware implementation, an exemplary embodiment of the present disclosure may be implemented by one or more application specific integrated circuits (ASICs), digital signal processors (DSPs), digital signal processing devices (DSPDs), programmable logic devices (PLDs), processors, controllers, micro-controllers, microprocessors, and the like. For a firmware or software implementation, embodiments of the present disclosure may be implemented by in the form of modules, procedures, functions, and the like that perform the above-described functions or operations. For example, software codes may be stored in a memory unit and may be executed by a processor. The memory unit may be located in or outside the processor, and may exchange data with the processor by various means already known.

It is apparent to one of ordinary skill in the art that the present disclosure may be implemented into various specific forms without departing from the features of the present disclosure. Accordingly, the foregoing detailed description should not be interpreted limitedly in all aspects, but should be considered to be for illustrative purposes. Therefore, the scope of the present disclosure should be determined by the reasonable interpretation of the claims, and all the modifications within the equivalent scope of the present disclosure are included in the scope of the present disclosure.

What is claimed is:

1. A control pilot (CP) signal detection method for a vehicle charger that charges a battery mounted in an electric vehicle (EV) by receiving power supplied from an electric vehicle supply equipment (EVSE), the CP signal detection method comprising:
   counting, by a power controller equipped in the vehicle charger, CP signals based on signal levels of the CP signals during a set period of time, when an input of the CP signals is detected while an ignition of the EV is turned off;
   determining, by the power controller, whether a count of high-level CP signals among the CP signals is within a reference range, when the set period of time elapses; and
   outputting, by the power controller, state information of the CP signals based on the determination of whether the count of high-level CP signals is within the reference range, wherein
   the counting of the CP signals includes:
      verifying the signal levels of the CP signals every time a clock signal is generated;
      classifying the CP signals into the high-level CP signals and low-level CP signals based on the verified signal levels;
      counting the high-level CP signals; and
      counting the low-level CP signals,
   the state information includes information regarding whether the CP signals are detected and information regarding a form of the CP signals,
   the power controller is configured to monitor the CP signals which are generated by the EVSE while the ignition of the EV is turned off and to control a main power source of the vehicle charger that is mounted within the vehicle charger and a sub-power source of the vehicle charger that is mounted within the vehicle charger, so as to turn the main power source and the sub-power source on or off, respectively, and
   the main power source is configured to supply power to a charging controller controlling a charging operation of the vehicle charger, and the sub-power source is configured to receive a CP signal generated by the EVSE and to supply power to the power controller in response to the CP signal received from the EVSE.

2. The CP signal detection method according to claim 1, wherein the outputting of state information of the CP signals comprises outputting state information indicating that the CP signals have been inputted and are pulse width modulation (PWM) signals, when the count of the high-level CP signals is within the reference range.

3. The CP signal detection method according to claim 1, wherein the outputting of state information of the CP signals comprises outputting state information indicating that the CP signals have been inputted and are direct current (DC) signals, when the count of the high-level CP signals exceeds an upper limit threshold of the reference range.

4. The CP signal detection method according to claim 1, wherein the outputting of state information of the CP signals comprises outputting state information indicating that the CP signals have not been detected, when the count of the high-level CP signals is less than a lower limit threshold of the reference range.

5. A vehicle charger for charging a battery mounted in an electric vehicle (EV) by receiving power supplied from an electric vehicle supply equipment (EVSE), the vehicle charger comprising:
   a charging controller configured to control a charging operation of the vehicle charger;
   a main power source configured to supply main power to the charging controller and to cut-off the main power;
   a sub-power source configured to supply power to the battery as sub-power, when CP signals generated by the EVSE are input; and
   a power controller configured to monitor the CP signals generated by the EVSE while an ignition of the EV is turned off and to control the main power source of the vehicle charger that is mounted within the vehicle charger and the sub-power source of the vehicle charger that is mounted within the vehicle charger, so as to turn the main power source and the sub-power source on or off, respectively, wherein
   the power controller includes:
      a CP detector configured to classify and count the CP signals based on signal levels of the CP signals during a set period of time, to determine whether a count of the CP signals is within a reference range, and to output state information of the CP signals based on the determination of whether the count of the CP signals is within the reference range;
      an on/off controller configured to turn the main power source and the sub-power source on or off based on the outputted state information; and
      a clock generator configured to generate a clock signal to synchronize the CP detector and the on/off controller,
   the CP detector is further configured to verify the signal levels of the CP signals every time the clock signal is generated, to classify the CP signals into high-level CP signals and low-level CP signals based on the verified signal levels, to count the high-level CP signals, and to count the low-level CP signals,
   the state information includes information regarding whether the CP signals are detected and information regarding a form of the CP signals, and
   the sub-power source is configured to receive a CP signal generated by the EVSE and to supply power to the power controller in response to the CP signal received from the EVSE.

6. The vehicle charger according to claim 5, wherein the CP detector is further configured to output state information indicating that the CP signals have been inputted and are PWM signals, when a count of the high-level CP signals is within the reference range.

7. The vehicle charger according to claim 5, wherein the CP detector is further configured to output state information indicating that the CP signals have been inputted and are DC signals, when a count of the high-level CP signals exceeds an upper limit threshold of the reference range.

8. The vehicle charger according to claim 5, wherein the CP detector is further configured to output state information indicating that the CP signals have not been detected, when a count of the high-level CP signals is less than a lower limit threshold of the reference range.

9. A CP signal detection method for a vehicle charger that charges a battery mounted in an EV by receiving power supplied from an EVSE, the CP signal detection method comprising:
   classifying, by a power controller equipped in the vehicle charger, CP signals into high-level CP signals and low-level CP signals based on signal levels of the CP signals;
   counting, by the power controller, the high-level CP signals and the low-level CP signals, respectively, during a set period of time, while an ignition of a vehicle is turned off;
   determining, by the power controller, which of a count of the high-level CP signals and a count of the low-level CP signals exceeds a threshold; and
   determining, by the power controller, that a CP signal with a corresponding level is detected, based on which of the count of the high-level CP signals and the count of the low-level CP signals exceeds the threshold, wherein
   the power controller is configured to monitor the CP signals which are generated by the EVSE while the ignition of the EV is turned off and to control a main power source of the vehicle charger that is mounted within the vehicle charger and a sub-power source of the vehicle charger that is mounted within the vehicle charger, so as to turn the main power source and the sub-power source on or off, respectively, and
   the main power source is configured to supply power to a charging controller controlling a charging operation of the vehicle charger, and the sub-power source is configured to receive a CP signal generated by the EVSE and to supply power to the power controller in response to the CP signal received from the EVSE.

10. The CP signal detection method according to claim 9, further comprising invalidating a detection of the high-level CP signal, when the low-level CP signal is detected after the high-level CP signal is determined to be detected.

11. The CP signal detection method according to claim 9, further comprising invalidating a detection of the low-level CP signal, when the high-level CP signal is detected after the low-level CP signal is determined to be detected.

* * * * *